United States Patent [19]

Babenko et al.

[11] 3,999,206
[45] Dec. 21, 1976

[54] SEMICONDUCTOR INDICATING DEVICE AND METHOD FOR PRODUCTION OF SAME

[76] Inventors: Vladimir Alexandrovich Babenko, ulitsa Sadovo-Karetnaya, 8, kv. 60; Galina Georgievna Boeva, Zavodskoi proezd, 20, kv. 102, both of Moscow; Eduard Efimovich Violin, prospext Nauki, 16, korpus 1, kv. 89; Jury Alexandrovich Vodakov, prospekt Engelsa, 69/1, kv. 35, both of Leningrad; Eleonora Grigorievna Ivanova, Erevanskaya ulitsa, 13, korpus 1, kv. 12; Tatyana Georgievna Kmita, Odesskaya ulitsa, 17, kv. 63, both of Moscow; Vadim Ivanovich Pavlichenko, ulitsa Polevaya, 20/1, Kaliningrad Moskovskoi oblasti; Igor Veniaminovich Ryzhikov, 9 Parkovaya ulitsa, 49, korpus 1, kv. 67, Moscow; Georgy Fedorovich Kholuyanov, ulitsa Manchesterskaya, 18, kv. 73, Leningrad; Igor Ivanovich Kruglov, 15 Parkovaya ulitsa, 46, korpus 1, kv. 35, Moscow; Galina Alexandrovna Lomakina, prospekt Engelsa, 69/1, kv. 109, Leningrad; Vladimir Pavlovich Novikov, 13 Parkovaya ulitsa, 40, korpus 2, kv. 24, Moscow, all of U.S.S.R.

[22] Filed: Dec. 29, 1975

[21] Appl. No.: 645,098

Related U.S. Application Data

[63] Continuation of Ser. No. 520,870, Nov. 4, 1974, abandoned, which is a continuation of Ser. No. 330,586, Oct. 5, 1973, abandoned.

[52] U.S. Cl. ............................... 357/17; 357/63; 357/58
[51] Int. Cl.² ......................................... H01L 33/00
[58] Field of Search ................... 357/17, 63, 64, 58

[56] References Cited

UNITED STATES PATENTS

| | | | |
|---|---|---|---|
| 3,663,722 | 5/1972 | Kamath | 148/172 |
| 3,742,598 | 7/1973 | Nishida | 29/574 |
| 3,806,774 | 4/1974 | Hartman | 317/235 R |
| 3,829,333 | 8/1974 | Tohi | 148/1.5 |
| 3,900,864 | 8/1975 | Dapkus | 357/18 |
| 3,930,912 | 1/1976 | Wisbey | 156/3 |
| 3,931,631 | 1/1976 | Groves et al. | 357/17 |

*Primary Examiner*—Martin H. Edlow
*Attorney, Agent, or Firm*—Holman & Stern

[57] ABSTRACT

A semiconductor display of digital data device using a semiconductor crystal wherein the p-region has a thickness of 0.1–0.3 μm, the concentration of neutral atoms in the n-region is from $1.5 \times 10^{18}$ to $5 \times 10^{18}$ cm$^{-3}$ and the thickness of the compensated region disposed between said two regions containing a luminescence activator, has a thickness of 0.5–1.2 μm.

A method for production of a semiconductor digital display device whereby the p-n junction is formed by introducing an impurity which has a high surface concentration and a low diffusion coefficient in silicon carbide and then a luminescence activator is introduced from the same side to a depth exceeding by 3–4 times the diffusion depth.

The device features a high resistance of the diffused region adjoining the luminescence contacts.

5 Claims, 2 Drawing Figures

SEMICONDUCTOR INDICATING DEVICE AND METHOD FOR PRODUCTION OF SAME

This is a continuation of application Ser. No. 520,870 filed Nov. 4, 1974 which in turn is a continuation of Ser. No. 330,586 filed Oct. 5, 1973 both of which are now abandoned.

The invention relates to semiconductor devices and more particularly, to semiconductor digital display devices and methods for production of same.

Known in the art are semiconductor light sources designed for displaying various information.

In a known multi-element monolithic light source based on a silicon carbide that has a pn-junction parallel to the main surfaces of the body and that emits light, when forward biased, all over the surface of the body, the light-emitting of separate elements has been provided by removing the portions of the silicon carbide body around the separate elements to the depth exceeding the depth of the pn-junction. The methods employed to remove the material are rather laborious and require the use of precision ultrasonic equipment or chemical treatment which does not always produce the accurate relief of the device. For a number of materials, specifically the silicon carbide, this operation is rather hard to perform.

The p-n-n$^+$ structures of these devices are rather wide and have a relatively high resistance, owing to which the material has to be removed to rather a large depth.

Besides, the thicknesses of the p-region and compensated region formed by one impurity are such that the luminescence efficiency is not sufficiently high, especially at low current densities (0.3 A/cm$^2$ and below) which are essential to reduce the current consumption of the digital display device, and the forward voltage drops across the p-n junctions are somewhat higher due to the voltage drop across the material.

The intensity of light emitted by such devices does not exceed 10–15 cd/m$^2$.

The low luminescence efficiency of such p-n junctions formed by, say, boron or beryllium results from high diffusion coefficients of these impurities in silicon carbide and their low surface concentration which can be obtained in practice. The layers of the p-n-n$^+$ structure of these devices are rather wide and their resistance is rather high due to the high activation energy of the impurity.

The specific object of the present invention is to provide a semiconductor digital display device and a method for production of same, having a structure which can be produced without the removal of semiconductor material around the independent luminescent contacts.

The invention consists in that a semiconductor indicating device has a three-layer crystal structure comprising a diffused p-region being complete and uniform along its whole area and having a thickness of 0.1–03 μm; an n-region having a thickness of 0.5–1.2 μm with a concentration of neutral atoms of 1.5×10$^{18}$ to 5×10$^{18}$cm$^{-3}$; a compensated region arranged between these two regions having a thickness of 0.5–1.2 μm and containing a luminescent activator; one ohmic contact to the single type conductivity region; some ohmic contacts to the extreme diffused region of the opposite type conductivity whereas the shape and sizes of each contact determine the shape and sizes of the light-radiating elements which are luminescent over the entire area of the ohmic contact under which they are positioned, whereas the localized luminescence under the areas of the ohmic contacts takes place only when the relation of the resistance of the region adjacent to each ohmic contact is not less than 10.

The invention also consists in that, according to the method for production of a semiconductor device made from a silicon carbide crystal doped with impurities, the p-n junction is formed by introducing an acceptor impurity having a high surface concentration and low diffusion coefficient in silicon carbide, an acceptor type luminescence activator is introduced from the same side to a concentration smaller than donor concentration in the base material to a depth 3–4 times larger than the depth of the first impurity and then independent contacts are vapor deposited onto the common diffused layer.

The invention further consists in a method for production of a semi-conductor digital display device made from a silicon carbide crystal doped with impurities for simultaneous formation of independent luminescent contacts on the common p-n junction, wherein, according to the invention, the compensated region is formed by introducing an acceptor-type luminescence activator to a concentration smaller than donor concentration in the base material, an acceptor impurity is introduced from the same side to form a p-n junction to a depth one-third or one-fourth the depth of the compensated layer and then independent contacts which display information are deposited on the common p-region.

An aluminum layer may be deposited on the silicon carbide crystal from the side of the independent contacts provided on the crystal to form a protective mask due to the cohesion forces and then a silicon carbide layer may be etched to a depth of up to 0.3 μm with the mixture of molten potassium nitrates and caustic potash at a temperature of 550° to 750° C.

The diffused region adjoining to the luminescent contacts must be preferably bombarded with ions of argon, nitrogen or oxygen to increase the resistance of this region and quench luminescence.

All the objects, features and advantages of the invention will become more apparent by reference to the following description in conjunction with the accompanying drawing, in which.

Figure 1:
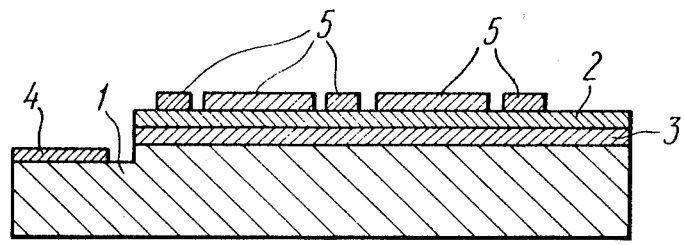
FIG. 1 shows a sectional view of the semiconductor multi-element light source according to the invention.
Figure 2:
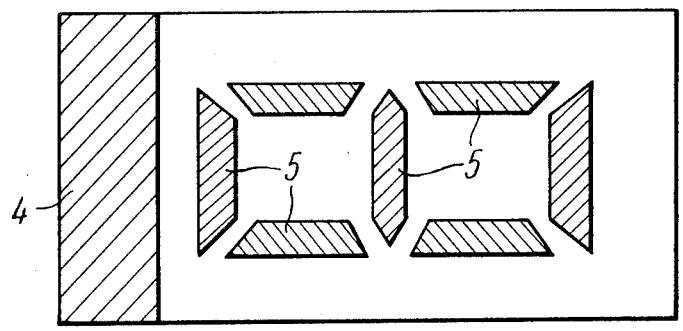
FIG. 2 shows the plan view of the construction of the semiconductor multi-element light source of FIG. 1.

The semiconductor digital display device described herein comprises a base crystal of n-type silicon carbide 1 300–400 μm thick with uncompensated nitrogen donor concentration of 1.5×10$^{18}$ – 5×10$^{18}$ cm$^{-3}$, a p-type surface layer 2 of said crystal 0.1–0.3 μm thick, doped with an acceptor impurity, such as aluminium, and an n-type compensated region 3 0.3–1.2 μm thick, disposed under the surface layer and doped with an acceptor impurity which activates luminescence, such as boron, to a depth 3–4 times the depth of the p-region, the resistivity of said two layers being within 1000 to 10000 ohm. cm. Besides, FIG. 1 shows a common ohmic contact 4 to the n-type base layer 2, and separate ohmic contacts 5 to the diffused layers, the area and the shape of the contact defining those of separate light-emitting elements of the multi-element light source.

Described below are the specific embodiments of the present invention relating to amber light sources which serve as digital display devices.

A seven-element amber light source with a "figure-of-eight" arrangement of the elements which enables all digits from zero to 1 to be formed is made from a base crystal of silicon carbide 350 μm thick with uncompensated nitrogen donor compensation of $3\times10^{18}$ cm$^{-3}$ whose p-type surface layer is formed by aluminum doping and has a resistivity of 2000 ohm.cm; adjoining this layer is a boron-doped compensated layer of n type, which has a resistivity of 3000 ohm. cm.

Seven ohmic contacts which form the elements of the "figure-of-eight" are deposited on the common diffused p-layer while one contact upon the base n-layer is deposited.

The resistance between the diffused layer and each of the contacts is 5 ohms; the resistance between the adjacent contacts upon the diffused layer is $2\times10^{5}$ ohms. Therefore when forward biased the elements emit amber light all through the area sharply defined by the outlines of the contacts, whereas the regions of the diffused layer adjoining the contact do not emit light.

The intensity of light emitted by the elements is 80–100 cd/m$^2$ at a current density of 3.5 A/cm$^3$; the device remains serviceable in the temperature range from −60° to +100° C.

The specific feature of the device is the presence of a very thin p-region which has rather a low resistance for silicon carbide and a comparatively thin compensated n-region, as a result of which the p-n junction has a good efficiency and the intensity of light emission is sufficiently high. Owing to these specific features of the layers any configuration of the luminescent elements may be formed on these layers by depositing ohmic contacts on the common diffused layer.

A comparatively low resistance of the p-layer formed in the structure described herein by aluminum which has a low activation energy in silicon carbide provides a sufficiently high efficiency of the p-n junction at low temperatures and reduces the forward resistance of the device to a minimum.

The semiconductor light source described herein is produced as follows.

An acceptor impurity which has a low diffusion coefficient and is capable of providing a high surface concentration, such as aluminum, is diffused into silicon carbide crystals to a depth of 0.1–0.3 μm. The temperature of the diffusion process is selected so as to ensure the maximum possible surface concentration without decomposing the base silicon carbide. Then an acceptor-type luminescence activator, such as boron, is diffused into the semiconductor crystal to a depth exceeding the depth of the p-n junction by 3–4 times, for example, to a depth of 0.3–1.2 μm.

The time and temperature of the diffusion process are varied within certain limits depending on the concentration of active nitrogen donors in the base material so as to obtain an aluminum-doped p-region with the resistivity of 1000–10000 ohm. cm. and a boron- and nitrogen-doped n-region with the resistivity of 1000–10000 ohm. cm. For example, aluminum diffusion is carried out at a temperature of 2000° C to 2200° C for 10 to 60 minutes, boron diffusion, at a lower temperature of 1920°–1960° C for 1–7 minutes.

Then ohmic contacts are deposited on the common diffused layer to form the desired set of digits and a common contact to the base crystal is deposited by, say, vapor deposition titanium and nickel.

Subsequently no mechanical, chemical or other treatment is required for electrical isolation of the elements due to a high resistance of the thin diffused layer between any two contacts.

The semiconductor light sources produced as above emit amber light with an intensity of 20–150 cd/m$^2$ at the current density of 0.35 A/cm$^2$ and remain serviceable at temperatures as low as −60° C.

In accordance with another method the structure described herein is produced by performing the following sequence of operations; diffusion of an acceptor with a low diffusion coefficient and high surface concentration, such as aluminum, at a temperature of 2000°–2300° C for 0.5–4 hours; diffusion of a luminescence activator, such as boron, at a temperature of 1920°–1980° C for 2–10 minutes; depositing of contacts which form the required configuration of the elements by aluminum vapor deposition; etching of the surface layer to a depth of 0.1 μm with molten potassium nitrates and caustic potash at a temperature of 550° C–750° C and depositing of the common contact to the n-region by vapor deposition or melting-in of metal, such as chrome, which forms a low-resistance contact.

The semiconductor devices produced by this method have a higher efficiency due to the lower resistance of the p-region; fringe glare of the elements is prevented by etching a very thin layer of silicon carbide around the contacts. As a result, the resistance between the contacts is as high as 6000–10000 ohms while the resistance under the contact may be within 0.1–5 ohms.

The intensity of light emission provided by such devices is 30–200 cd/m$^2$ at the current densities of 0.35–0.5 A/cm$^2$ and the devices remain serviceable at temperatures as low as −60° C.

In accordance with still another method the required structure of the device can be produced as follows: first an acceptor-type luminescence activator is diffused for a long time at not very high diffusion temperatures to form a compensated n-region, by say, diffusion of aluminum at a temperature of 1900°–2050° C for 8–20 hours, then an acceptor impurity, such as aluminum, is diffused at a temperature within 2000°–2300° C for 0.5–4 hours, to form a p-n junction. Metals, such as titanium and nickel, are sprayed to form metal contacts to the p-region and a common ohmic contact, and the surface of the silicon carbide crystal is bombarded with ions of a neutral impurity, such as argon, to form structural defects which quench luminescence and increase the surface resistance of the surface layer between the contacts.

In this structure fringe glare of the elements is prevented by the formation of a high-resistance sublayer between the contacts through ion bombardment.

The devices produced in accordance with this method provide light emission intensities within 300–200 cd/m$^2$ at the current densities of 0.35–0.5 A/cm$^2$.

The use of the light source having the structure described herein makes it possible to increase by 2–3 times the intensity of light emitted by the existing multi-element sources operating at current densities as low as 0.2–0.3 A/cm$^2$, increase the intensity of amber light sources by 3–4 times at current densities from 0.3 to 0.5 A/cm$^2$, increase by more than 3 times the output percentage of the amber light sources due to a high luminescence uniformity over the area of the slab, extend the operating temperature range to from −60° to +120° C and obtain light sources emitting light of various spectral composition by selecting the impurities (boron, gallium, aluminum, beryllium, scandium) which activate luminescence of various colours — amber, blue, blue-green, red, and green.

The multi-element light sources employing silicon carbide are used for visual display of information about the condition of the data input and output systems in computers and various control systems and are designed for use in various data-displaying, signalling and control boards as well as for printing data on photographic film in digital measuring instruments.

What is claimed is:

1. A semiconductor display device comprising a semiconductor crystal having a base n-region with a concentration of atoms of from $1.5\times10^{18}$ to $5\times10^{18}$ cm$^{-3}$, a surface diffused p-region 0.1 to 0.3 μm thick, continuous and uniform over the entire area, a compensated region 0.5 to 1.2 μm thick containing a luminescence activator, a single contact to the n-region, a plurality of ohmic contacts to the p-region, the shape and size of each one of said plurality of ohmic contacts determining the shape and size of the luminous surface portions when the ratio of the resistance between the ohmic contacts in the p-region to the resistance of the material adjoining each ohmic contact is not less than 10.

2. A semiconductor display device comprising a semiconductor crystal having a base n-region with a concentration of neutral atoms of from $1.5\times10^{18}$ to $5\times10^{18}$ cm$^{-3}$, a surface diffused p-region 0.1 to 0.3 μm thick formed by introducing into said crystal an acceptor impurity with a surface concentration of $1\times10^{19}$ cm$^{-3}$ and a diffusion coefficient of $10^{-10}$ cm$^2$/sec, a compensated region 0.5 to 1.2 μm thick disposed between said p- and n-regions and containing an acceptor-type luminescence activator introduced from the p-region side in a concentration less than the concentration on the base semiconductor region to a depth 3 to 4 times that of the acceptor impurity, an ohmic contact to the base n-region, a plurality of ohmic contacts on the diffused p-region, the shape and size of each of said plurality of ohmic contacts determining the shape and size of the luminous surface portions when the ratio of the resistance between the ohmic contacts in the p-region to the resistance of the material adjoining each ohmic contact is not less than 10.

3. A semiconductor display device comprising a semiconductor crystal having a base n-region with a concentration of atoms of from $1.5\times10^{18}$ to $5\times10^{18}$ cm$^{-3}$, a surface diffused p-region 0.1 to 0.3 μm thick formed by introducing into said crystal and acceptor impurity with a surface concentration of $1\times10^{19}$ cm$^{-3}$ and a diffusion coefficient of $10^{-10}$ cm$^2$/sec, a compensated region 0.5 and 1 μm thick disposed between said n- and p-regions and formed by way of introducing luminescence activators in a concentration less than the concentration in the base n-region of the crystal from the same side as in the case of forming the p-region, the acceptor impurity being introduced to a depth 3 to 4 times less than that of the compensated layer, an ohmic contact to the n-region, a plurality of ohmic contacts to the p-region, the shape and size of each of said plurality of ohmic contacts determining the shape and size of the luminous surface portions when the ratio of the resistance between two ohmic contacts in the p-region to the resistance of the semiconductor material adjoining each ohmic contact is not less than 10.

4. A semiconductor display device as claimed in claim 3, wherein an aluminum layer is deposited on the surface of a silicon carbide crystal from the p-region side to form a protective mask due to the surface tension forces, and said surface is etched to a depth of at least 0.3 μm between said plurality of ohmic contacts with a mixture of potassium nitrate and potassium hydroxide at a temperature of from 550° to 570° C.

5. A semiconductor display device as claimed in claim 2, wherein the diffused region adjoining said plurality of ohmic contacts is bombarded with ions of a gas selected from the group consisting of argon, nitrogen and oxygen in order to increase the resistance of said region and quench luminescence.

* * * * *